(12) United States Patent
Timmermans et al.

(10) Patent No.: US 7,049,761 B2
(45) Date of Patent: May 23, 2006

(54) LIGHT TUBE AND POWER SUPPLY CIRCUIT

(75) Inventors: Jos Timmermans, Dearborn, MI (US); Jean C. Raymond, Montreal (CA)

(73) Assignee: Altair Engineering, Inc., Troy, MI (US)

( * ) Notice: Subject to any disclaimer, the term of this patent is extended or adjusted under 35 U.S.C. 154(b) by 375 days.

(21) Appl. No.: 09/782,375

(22) Filed: Feb. 12, 2001

(65) Prior Publication Data

US 2002/0060526 A1 May 23, 2002

Related U.S. Application Data

(60) Provisional application No. 60/181,744, filed on Feb. 11, 2000.

(51) Int. Cl.
*H05B 37/02* (2006.01)

(52) U.S. Cl. .................. 315/246; 315/291; 315/185 S

(58) Field of Classification Search ................ 315/146, 315/291, 185 S, 312, 324, 192, 185 R, 295, 315/246, 187, 294, 56, 200 A, 61; 340/815.45; 362/488, 240, 219, 800, 369, 545, 288, 249

See application file for complete search history.

(56) References Cited

U.S. PATENT DOCUMENTS

| | | | | |
|---|---|---|---|---|
| 4,581,687 A | | 4/1986 | Nakanishi | |
| 4,748,545 A | * | 5/1988 | Schmitt | 362/219 |
| 5,388,357 A | | 2/1995 | Malita | |
| 5,463,280 A | * | 10/1995 | Johnson | 315/187 |
| 5,575,459 A | | 11/1996 | Anderson | |
| 5,607,227 A | | 3/1997 | Yasumoto et al. | |
| 5,655,830 A | | 8/1997 | Ruskouski | |
| 5,688,042 A | * | 11/1997 | Madadi et al. | 362/240 |
| 5,697,695 A | | 12/1997 | Lin et al. | |
| 5,726,535 A | * | 3/1998 | Yan | 315/185 R |
| 5,813,751 A | * | 9/1998 | Shaffer | 362/222 |
| 5,890,794 A | * | 4/1999 | Abtahi et al. | 362/183 |
| 5,924,784 A | * | 7/1999 | Chliwnyj et al. | 362/234 |
| 5,949,347 A | * | 9/1999 | Wu | 340/815.45 |
| 6,072,280 A | * | 6/2000 | Allen | 315/185 S |
| 6,158,882 A | * | 12/2000 | Bischoff, Jr. | 362/488 |
| 6,305,109 B1 | * | 10/2001 | Lee | 40/546 |
| 6,325,651 B1 | * | 12/2001 | Nishihara et al. | 439/232 |
| 6,371,637 B1 | * | 4/2002 | Atchinson et al. | 362/555 |
| 6,394,623 B1 | * | 5/2002 | Tsui | 362/249 |
| 6,577,072 B1 | * | 6/2003 | Saito et al. | 315/185 R |
| 6,582,103 B1 | * | 6/2003 | Popovich et al. | 362/307 |
| 6,621,222 B1 | * | 9/2003 | Hong | 315/51 |

OTHER PUBLICATIONS

Web page at http://trucklite.com/leds14.html printed on Jan. 13, 2000.
Web page at http://trucklite.com/leds2.html printed on Jan. 13, 2000.
Web page at http://trucklite.com/leds4.html printed on Jan. 13, 2000.
Web page at http://www.telecite.com/en/products/options_en.htm printed on Jan. 13, 2000.
Web page at http://www.dialight.com/trans.htm printed on Jan. 13, 2000.
Web page at http://www.ledlights.com/replac.htm printed on Jan. 13, 2000.
Ledtronics, apparently 1996 Catalog, apparently cover page and p. 10.

* cited by examiner

*Primary Examiner*—Wilson Lee
*Assistant Examiner*—Chuc Tran
(74) *Attorney, Agent, or Firm*—Young & Basile, P.C.

(57) ABSTRACT

The present invention provides a light tube for illumination by a power supply circuit including a bulb portion and a pair of end caps disposed at opposite ends of the bulb portion. A plurality of light emitting diodes are disposed inside the bulb portion and in electrical communication with the pair of end caps for illuminating in response to electrical current to be received from the power supply circuit.

26 Claims, 10 Drawing Sheets

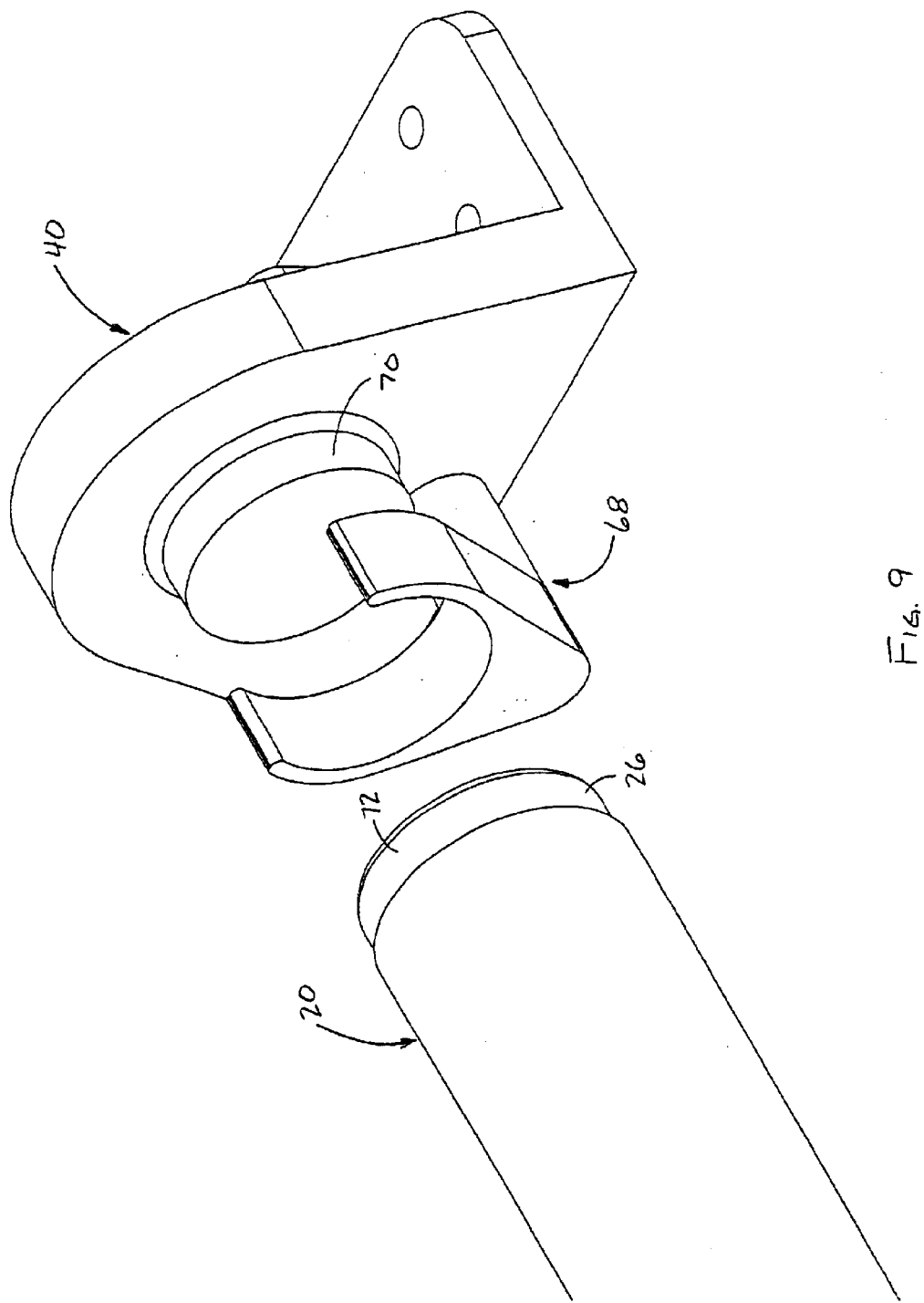

LIGHT TUBE AND POWER SUPPLY CIRCUIT

CROSS-REFERENCE TO RELATED APPLICATIONS

This application claims the benefit of U.S. Provisional Application Ser. No. 60/181,744 filed Feb. 11, 2000.

FIELD OF THE INVENTION

The present invention relates to a light tube illuminated by LEDs (light emitting diodes) which are packaged inside the light tube and powered by a power supply circuit.

BACKGROUND OF THE INVENTION

Conventional fluorescent lighting systems include fluorescent light tubes and ballasts. Such lighting systems are used in a variety of locations, such as buildings and transit buses, for a variety of lighting purposes, such as area lighting or backlighting. Although conventional fluorescent lighting systems have some advantages over known lighting options, such as incandescent lighting systems, conventional fluorescent light tubes and ballasts have several shortcomings. Conventional fluorescent light tubes have a short life expectancy, are prone to fail when subjected to excessive vibration, consume high amounts of power, require a high operating voltage, and include several electrical connections which reduce reliability. Conventional ballasts are highly prone to fail when subjected to excessive vibration. Accordingly, there is a desire to provide a light tube and power supply circuit which overcome the shortcomings of conventional fluorescent lighting systems. That is, there is a desire to provide a light tube and power supply circuit which have a long life expectancy, are resistant to vibration failure, consume low amounts of power, operate on a low voltage, and are highly reliable. It would also be desirable for such a light tube to mount within a conventional fluorescent light tube socket.

SUMMARY OF THE INVENTION

A light tube for illumination by a power supply circuit includes a bulb portion and a pair of end caps disposed at opposite ends of the bulb portion. A plurality of light emitting diodes are disposed inside the bulb portion and in electrical communication with the pair of end caps, which diodes illuminate in response to electrical current received from the power supply circuit.

BRIEF DESCRIPTION OF THE DRAWINGS

The description herein makes reference to the accompanying drawings wherein like reference numerals refer to like parts throughout the several views, and wherein.

DESCRIPTION OF THE PREFERRED EMBODIMENT

Figure 1:
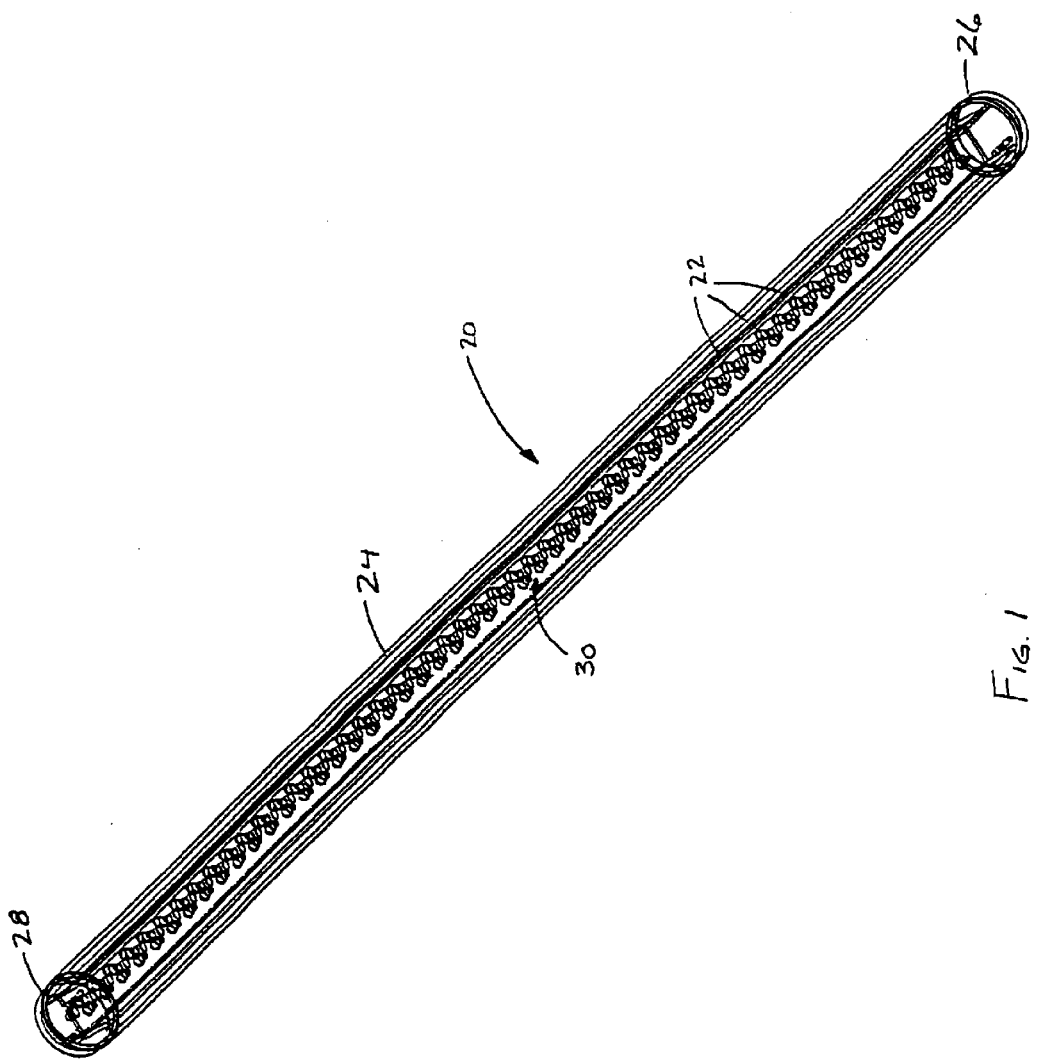
FIG. 1 is a line drawing showing a light tube, in perspective view, which in accordance with the present invention is illuminated by LEDs packaged inside the light tube.

FIG. 1 is a line drawing showing a light tube 20 in perspective view. In accordance with the present invention, the light tube 20 is illuminated by LEDs 22 packaged inside the light tube 20. The light tube 20 includes a cylindrically shaped bulb portion 24 having a pair of end caps 26 and 28 disposed at opposite ends of the bulb portion. Preferably, the bulb portion 24 is made from a transparent or translucent material such as glass, plastic, or the like. As such, the bulb material may be either clear or frosted.

In a preferred embodiment of the present invention, the light tube 20 has the same dimensions and end caps 26 and 28 (e.g. electrical male bi-pin connectors, type G13) as a conventional fluorescent light tube. As such, the present invention can be mounted in a conventional fluorescent light tube socket (not shown).

The line drawing of FIG. 1 also reveals the internal components of the light tube 20. The light tube 20 further includes a circuit board 30 with the LEDs 22 mounted thereon. The circuit board 30 and LEDs 22 are enclosed inside the bulb portion 24 and the end caps 26 and 28.

Figure 2:
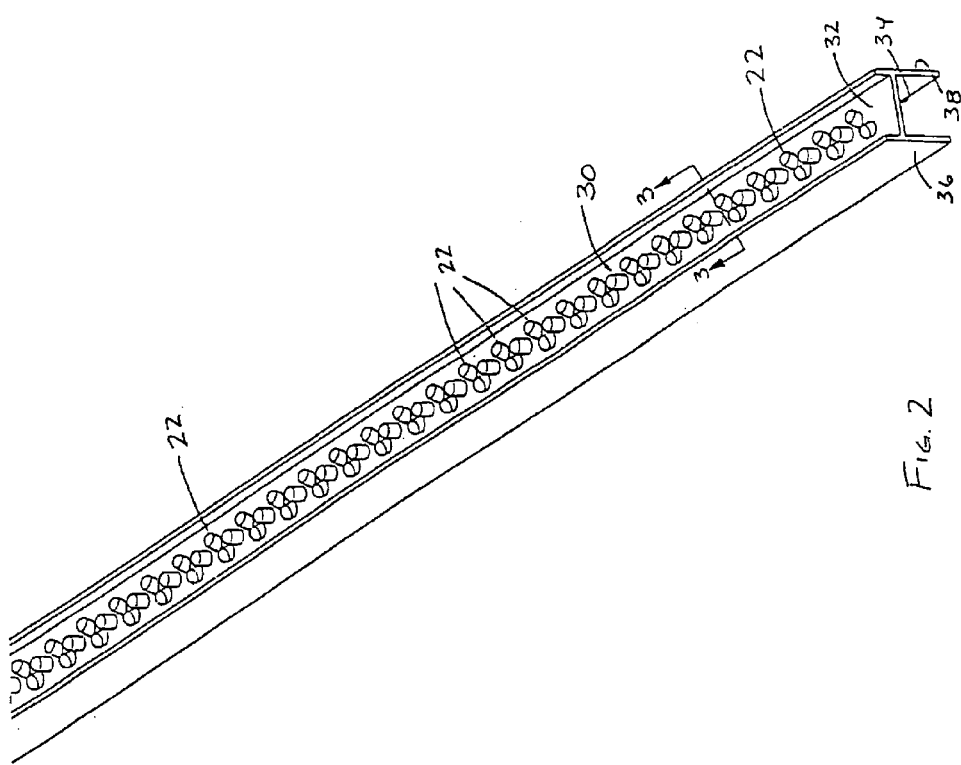
FIG. 2 is a perspective view of the LEDs mounted on a circuit board.

FIG. 2 is a perspective view of the LEDs 22 mounted on the circuit board 30. A group of LEDs 22, as shown in FIG. 2, is commonly referred to as a bank or array of LEDs. Within the scope of the present invention, the light tube 20 may include one or more banks or arrays of LEDs 22 mounted on one or more circuit boards 30. In a preferred embodiment of the present invention, the LEDs 22 emit white light and, thus, are commonly referred to in the art as white LEDs. In FIGS. 1 and 2, the LEDs 22 are mounted to one surface 32 of the circuit board 30. In a preferred embodiment of the present invention, the LEDs 22 are arranged to emit or shine white light through only one side of the bulb portion 24, thus directing the white light to a predetermined point of use. This arrangement reduces light losses due to imperfect reflection in a conventional lighting fixture. In alternative embodiments of the present invention, LEDs 22 may also be mounted, in any combination, to the other surfaces 34, 36, and/or 38 of the circuit board 30.

Figure 3:
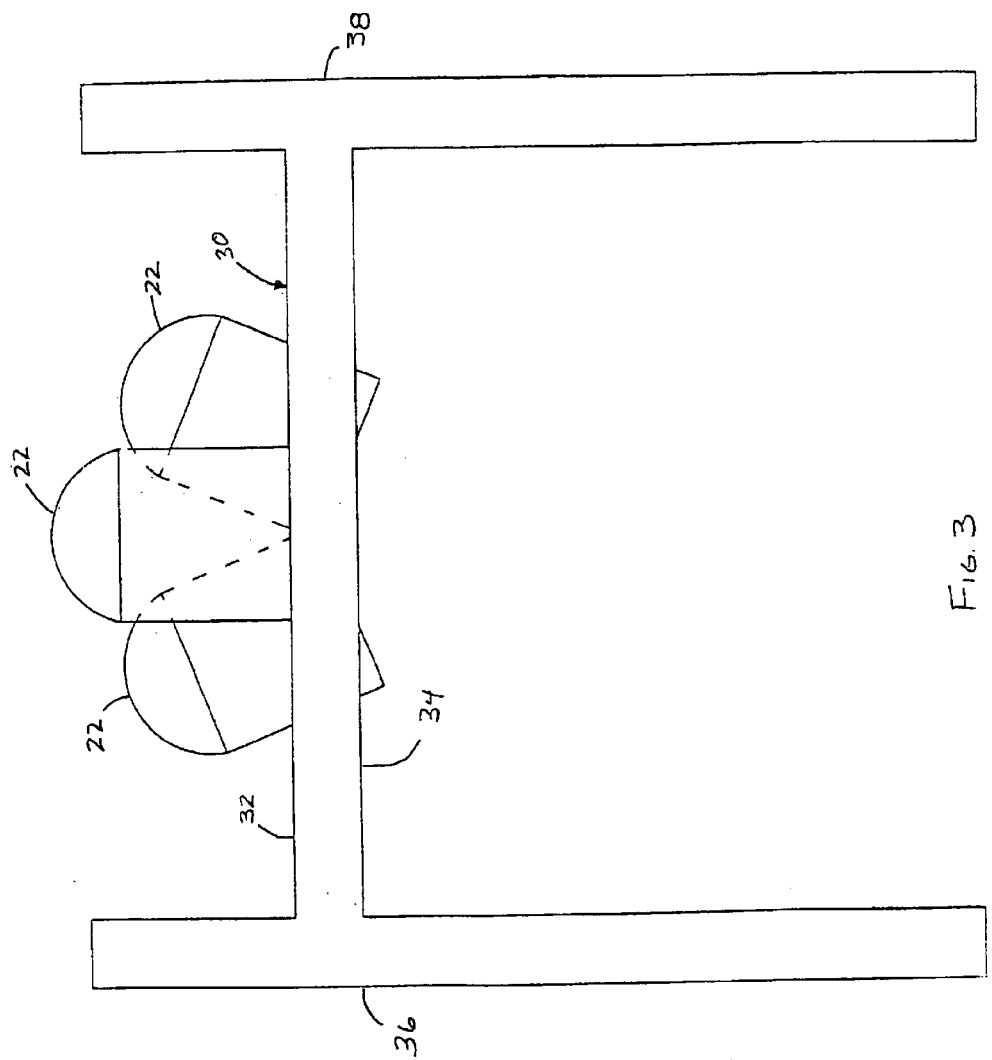
FIG. 3 is a cross-sectional view of FIG. 2 taken along lines 3—3.

FIG. 3 is a cross-sectional view of FIG. 2 taken along lines 3—3. To provide structural strength along the length of the light tube 20, the circuit board 30 is designed with a H-shaped cross-section. To produce a predetermined radiation pattern or dispersion of light from the light tube 20, each LED 22 is mounted at an angle relative to adjacent LEDs and/or the mounting surface 32. The total radiation pattern of light from the light tube 20 is effected by (1) the mounting angle of the LEDs 22 and (2) the radiation pattern of light from each LED. Currently, white LEDs having a viewing range between 6° and 45° are commercially available.

Figure 4:
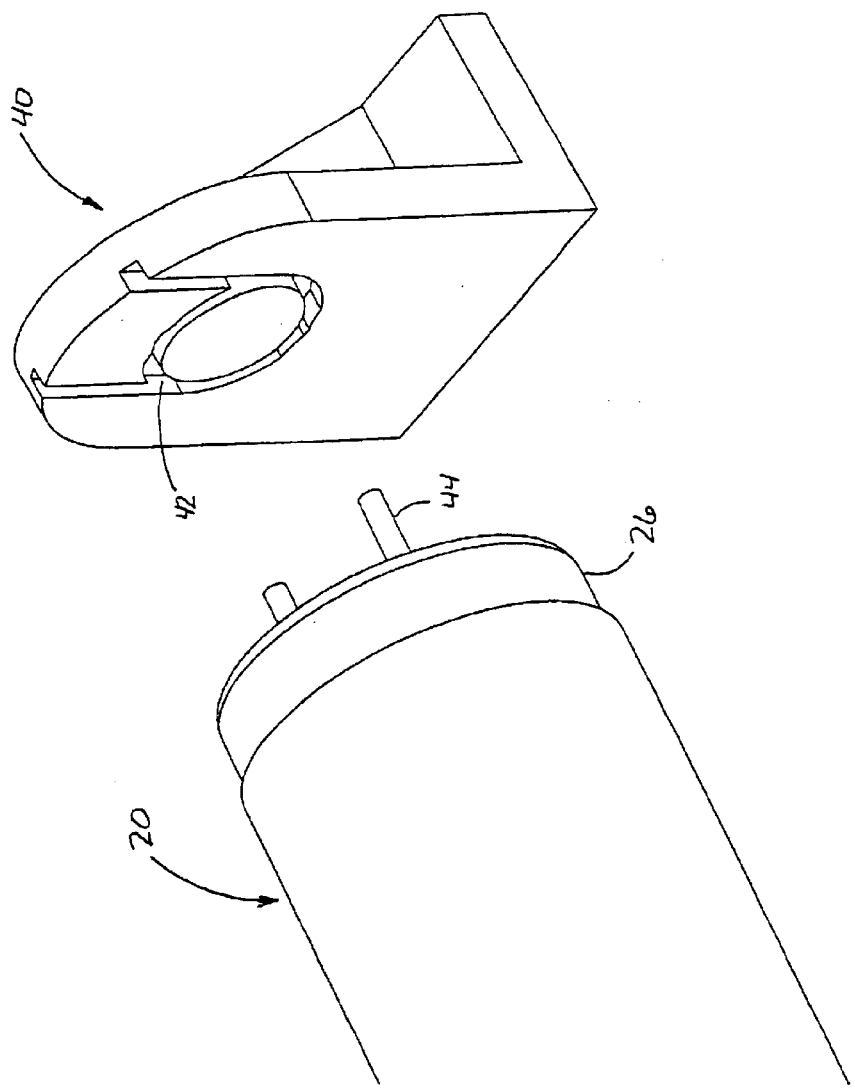
FIG. 4 is a fragmentary, perspective view of one embodiment of the present invention showing one end of the light tube disconnected from one end of a light tube socket.

FIG. 4 is a fragmentary, perspective view of one embodiment of the present invention showing one end of the light tube 20 disconnected from one end of a light tube socket 40.

Similar to conventional fluorescent lighting systems and in this embodiment of the present invention, the light tube socket 40 includes a pair of electrical female connectors 42 and the light tube 20 includes a pair of mating electrical male connectors 44.

Within the scope of the present invention, the light tube 20 may be powered by one of four power supply circuits 100, 200, 300, and 400. A first power supply circuit includes a power source and a conventional fluorescent ballast. A second power supply circuit includes a power source and a rectifier/filter circuit. A third power supply circuit includes a DC power source and a PWM (Pulse Width Modulation) circuit. A fourth power supply powers the light tube 20 inductively.

Figure 5:
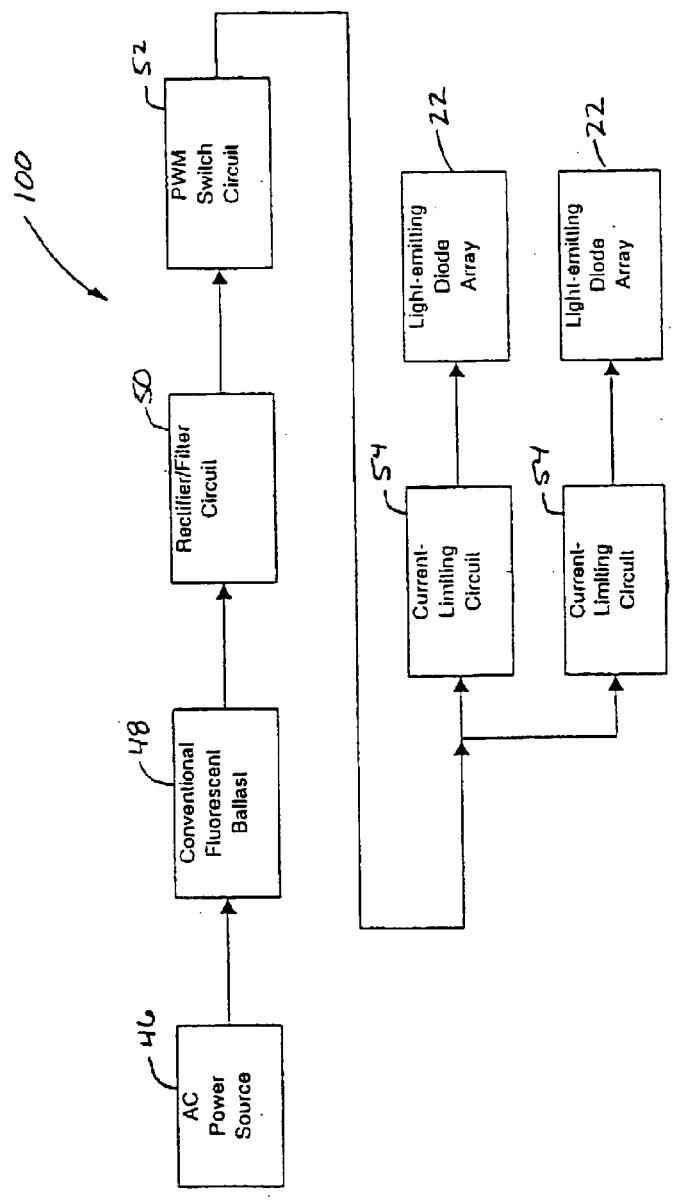
FIG. 5 is an electrical block diagram of a first power supply circuit for supplying power to the light tube.

FIG. 5 is an electrical block diagram of a first power supply circuit 100 for supplying power to the light tube 20. The first power supply circuit 100 is particularly adapted to operate within an existing, conventional fluorescent lighting system. As such, the first power supply circuit 100 includes a conventional fluorescent light tube socket 40 having two electrical female connectors 42 disposed at opposite ends of the socket. Accordingly, a light tube 20 particularly adapted for use with the first power supply circuit 100 includes two end caps 26 and 28, each end cap having the form of an electrical male connector 44 which mates with a corresponding electrical female connector 42 in the socket 40.

The first power supply circuit 100 also includes a power source 46 and a conventional magnetic or electronic fluorescent ballast 48. The power source 46 supplies power to the conventional fluorescent ballast 48.

The first power supply circuit 100 further includes a rectifier/filter circuit 50, a PWM circuit 52, and one or more current-limiting circuits 54. The rectifier/filter circuit 50, the PWM circuit 52, and the one or more current-limiting circuits 54 of the first power supply circuit 100 are packaged inside one of the two end caps 26 or 28 of the light tube 20.

The rectifier/filter circuit 50 receives AC power from the ballast 48 and converts the AC power to DC power. The PWM circuit 52 receives the DC power from the rectifier/filter circuit 50 and pulse-width modulates the DC power to the one or more current-limiting circuits 54. In a preferred embodiment of the present invention, the PWM circuit 52 receives the DC power from the rectifier/filter circuit 50 and cyclically switches the DC power on and off to the one or more current-limiting circuits 54. The DC power is switched on and off by the PWM circuit 52 at a frequency which causes the white light emitted from the LEDs 22 to appear, when viewed with a "naked" human eye, to shine continuously. The PWM duty cycle can be adjusted or varied by control circuitry (not shown) to maintain the power consumption of the LEDs 22 at safe levels.

The DC power is modulated for several reasons. First, the DC power is modulated to adjust the brightness or intensity of the white light emitted from the LEDs 22 and, in turn, adjust the brightness or intensity of the white light emitted from the light tube 20. Optionally, the brightness or intensity of the white light emitted from the light tube 20 may be adjusted by a user. Second, the DC power is modulated to improve the illumination efficiency of the light tube 20 by capitalizing upon a phenomenon in which short pulses of light at high brightness or intensity to appear brighter than a continuous, lower brightness or intensity of light having the same average power. Third, the DC power is modulated to regulate the intensity of light emitted from the light tube 20 to compensate for supply voltage fluctuations, ambient temperature changes, and other such factors which effect the intensity of white light emitted by the LEDs 22. Fourth, the DC power is modulated to raise the variations of the frequency of light above the nominal variation of 120 to 100 Hz thereby reducing illumination artifacts caused by low frequency light variations, including interactions with video screens. Fifth, the DC power may optionally be modulated to provide an alarm function wherein light from the light tube 20 cyclically flashes on and off.

The one or more current-limiting circuits 54 receive the pulse-width modulated or switched DC power from the PWM circuit 52 and transmit a regulated amount of power to one or more arrays of LEDs 22. Each current-limiting circuit 54 powers a bank of one or more white LEDs 22. If a bank of LEDs 22 consists of more than one LED, the LEDs are electrically connected in series in an anode to cathode arrangement. If brightness or intensity variation between the LEDs 22 can be tolerated, the LEDs can be electrically connected in parallel.

The one or more current-limiting circuits 54 may include (1) a resistor, (2) a current-limiting semiconductor circuit, or (3) a switching power supply type current limiter.

Figure 6:
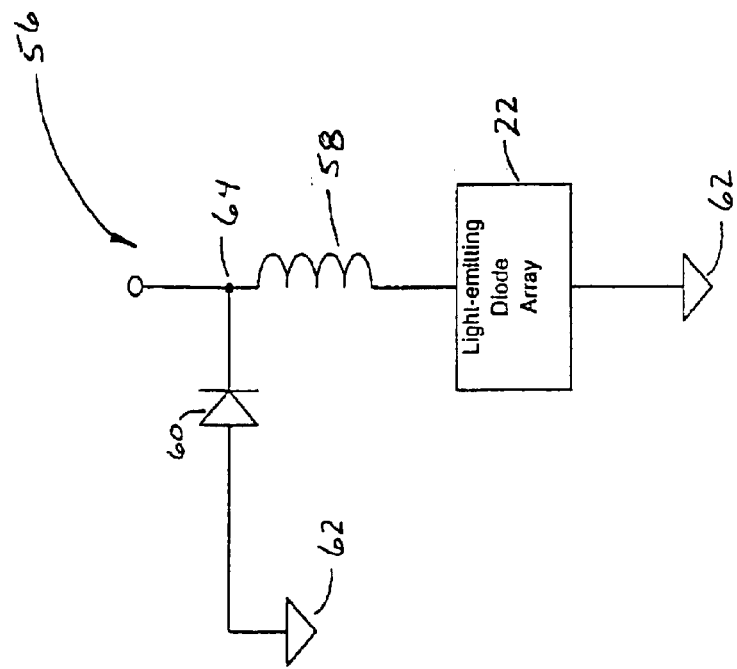
FIG. 6 is an electrical schematic of a switching power supply type current limiter.

FIG. 6 is an electrical schematic of a switching power supply type current limiter 56. The limiter 56 includes an inductor 58, electrically connected in series between the PWM circuit 52 and the array of LEDs 22, and a power diode 60, electrically connected between ground 62 and a PWM circuit/inductor node 64. The diode 60 is designed to begin conduction after the PWM circuit 52 is switched off. In this case, the value of the inductor 58 is adjusted in conjunction with the PWM duty cycle to provide the benefits described above. The switching power supply type current limiter 56 provides higher power efficiency than the other types of current-limiting circuits listed above.

Figure 7:
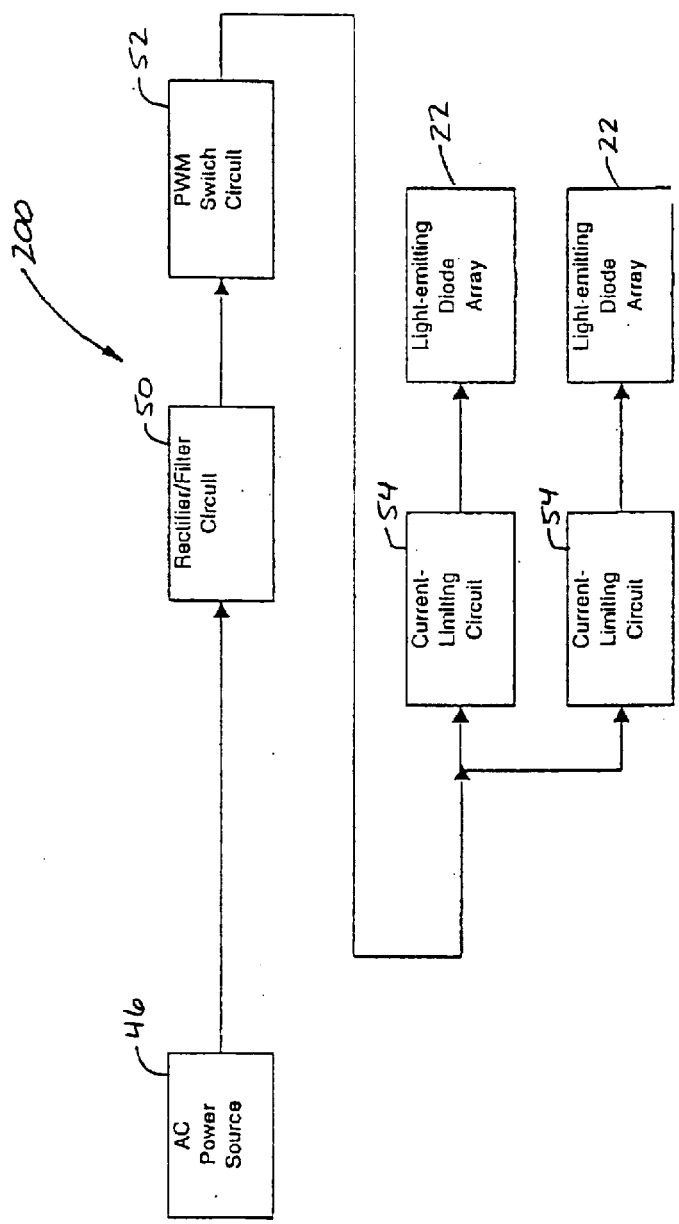
FIG. 7 is an electrical block diagram of a second power supply circuit for supplying power to the light tube.

FIG. 7 is an electrical block diagram of a second power supply circuit 200 for supplying power to the light tube 20. Similar to the first power supply circuit 100, the second power supply circuit 200 includes a conventional fluorescent light tube socket 40 having two electrical female connectors 42 disposed at opposite ends of the socket 40. Accordingly, a light tube 20 particularly adapted for use with the second power supply circuit 200 includes two end caps 26 and 28, each end cap having the form of an electrical male connector 44 which mates with a corresponding electrical female connector 42 in the socket 40.

In the second power supply circuit 200, the power source 46 supplies power directly to the rectifier/filter circuit 50. The rectifier/filter circuit 50, the PWM circuit 52, and the one or more current-limiting circuits 54 operate as described above to power the one or more arrays of LEDs 22. The rectifier/filter circuit 50, the PWM circuit 52, and the one or more current-limiting circuits 54 of the second power supply circuit 200 are preferably packaged inside the end caps 26 and 28 or the bulb portion 24 of the light tube 20 or inside the light tube socket 40.

Figure 8:
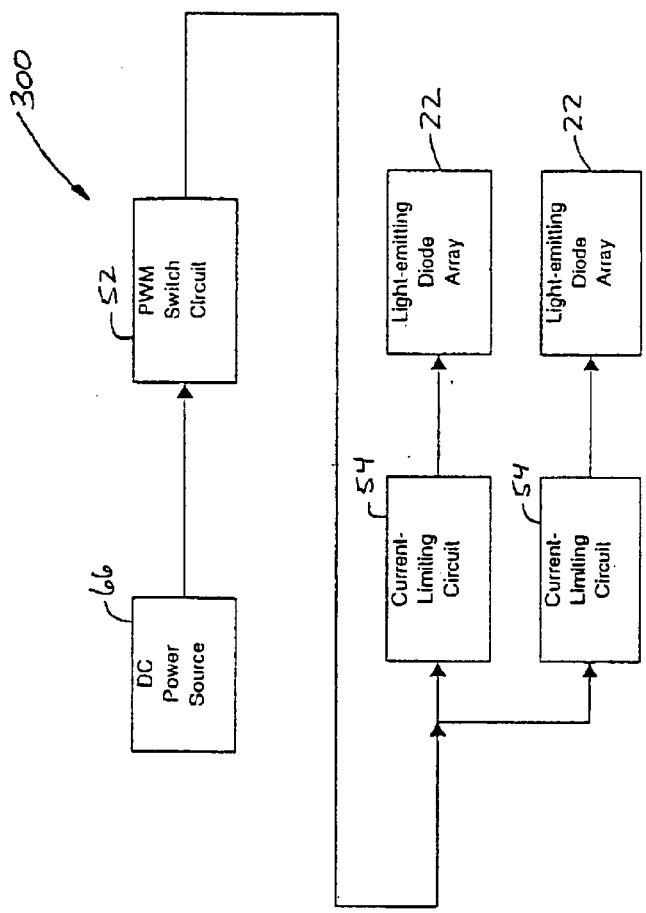
FIG. 8 is an electrical block diagram of a third power supply circuit for supplying power to the light tube.

FIG. 8 is an electrical block diagram of a third power supply circuit 300 for supplying power to the light tube 20. Similar to the first and second power supply circuits 100 and 200, the third power supply circuit 300 includes a conventional fluorescent light tube socket 40 having two electrical female connectors 42 disposed at opposite ends of the socket 40. Accordingly, a light tube 20 particularly adapted for use with the third power supply circuit 300 includes two end caps 26 and 28, each end cap having the form of an electrical male connector 44 which mates with a corresponding electrical female connector 42 in the socket 40.

The third power supply circuit 300 includes a DC power source 66, such as a vehicle battery. In the third power supply circuit 300, the DC power source 66 supplies DC power directly to the PWM circuit 52. The PWM circuit 52 and the one or more current-limiting circuits 54 operate as described above to power the one or more arrays of LEDs 22. In the third power supply circuit 300, the PWM circuit 52 is preferably packaged in physical location typically occupied by the ballast of a conventional fluorescent lighting system while the one or more current-limiting circuits 54 and LEDs 22 are preferably packaged inside the light tube 20, in either one of the two end caps 26 or 28 or the bulb portion 24.

Figure 9:
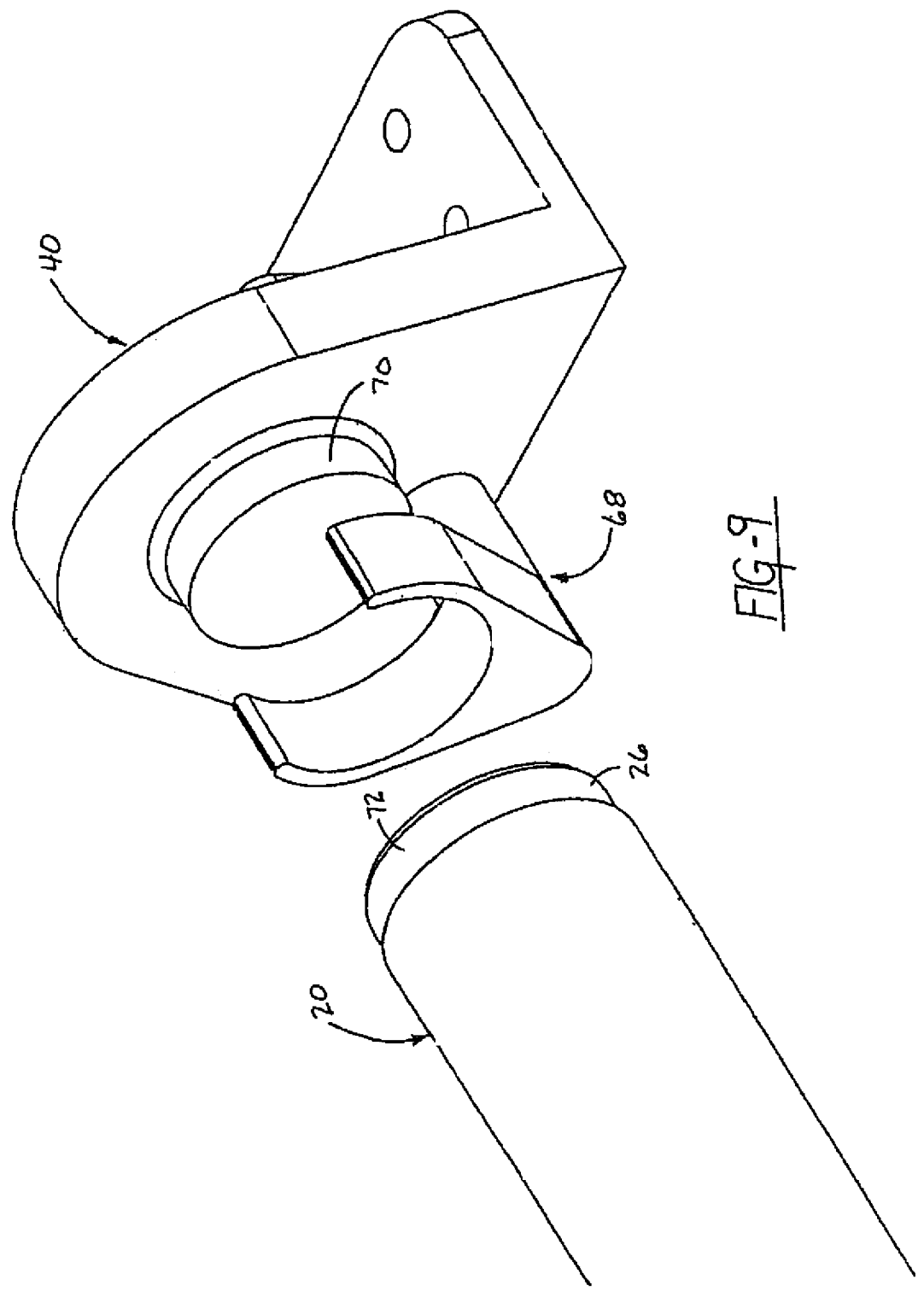
FIG. 9 is a fragmentary, perspective view of another embodiment of the present invention showing one end of the light tube disconnected from one end of the light tube socket.

FIG. 9 is a fragmentary, perspective view of another embodiment of the present invention showing one end of the light tube 20 disconnected from one end of the light tube socket 40. In this embodiment of the present invention, the light tube socket 40 includes a pair of brackets 68 and the light tube 20 includes a pair of end caps 26 and 28 which mate with the brackets 68.

Figure 10:
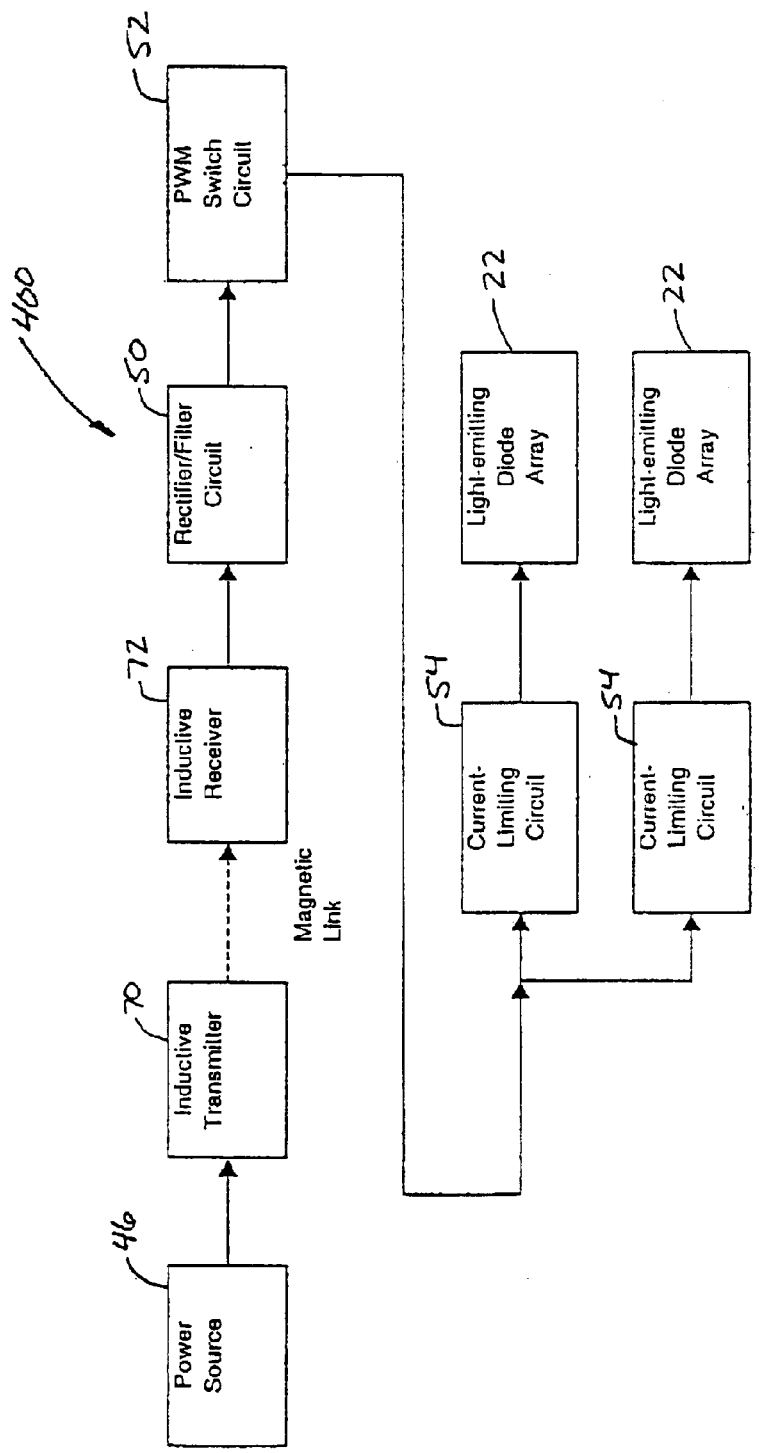
FIG. 10 is an electrical block diagram of a fourth power supply circuit for supplying power to the light tube.
Figure 2:
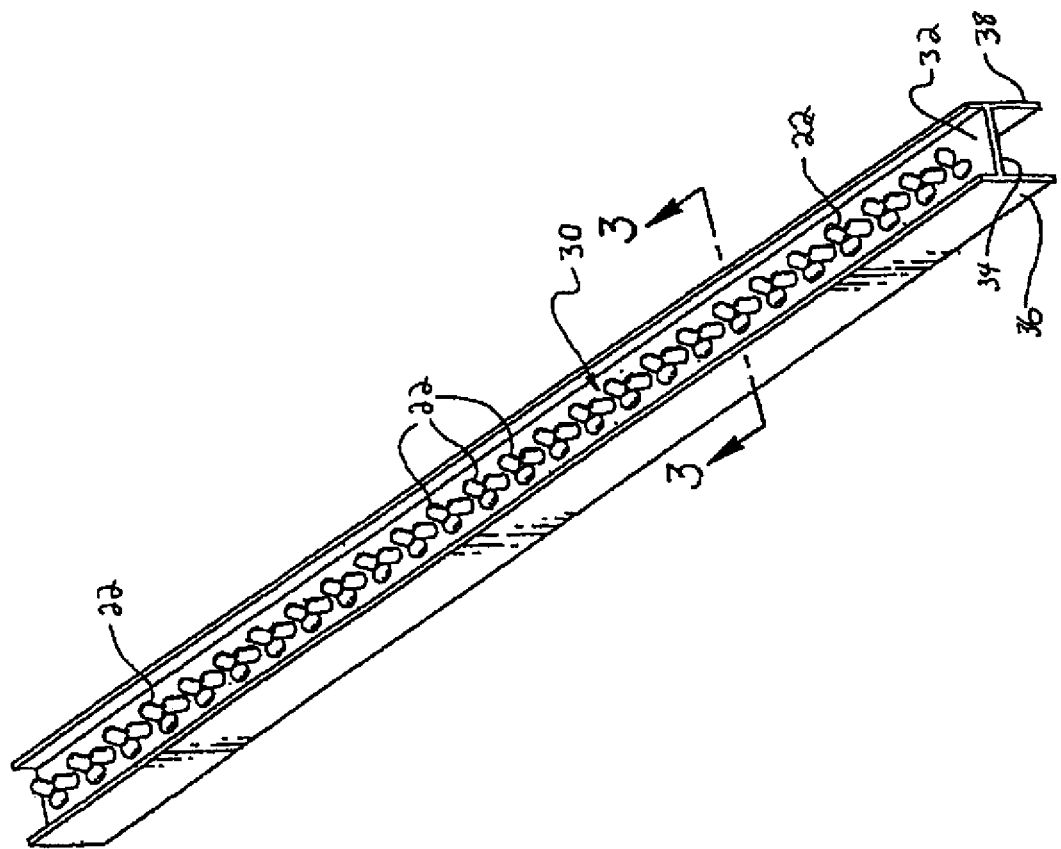
Figure 7:
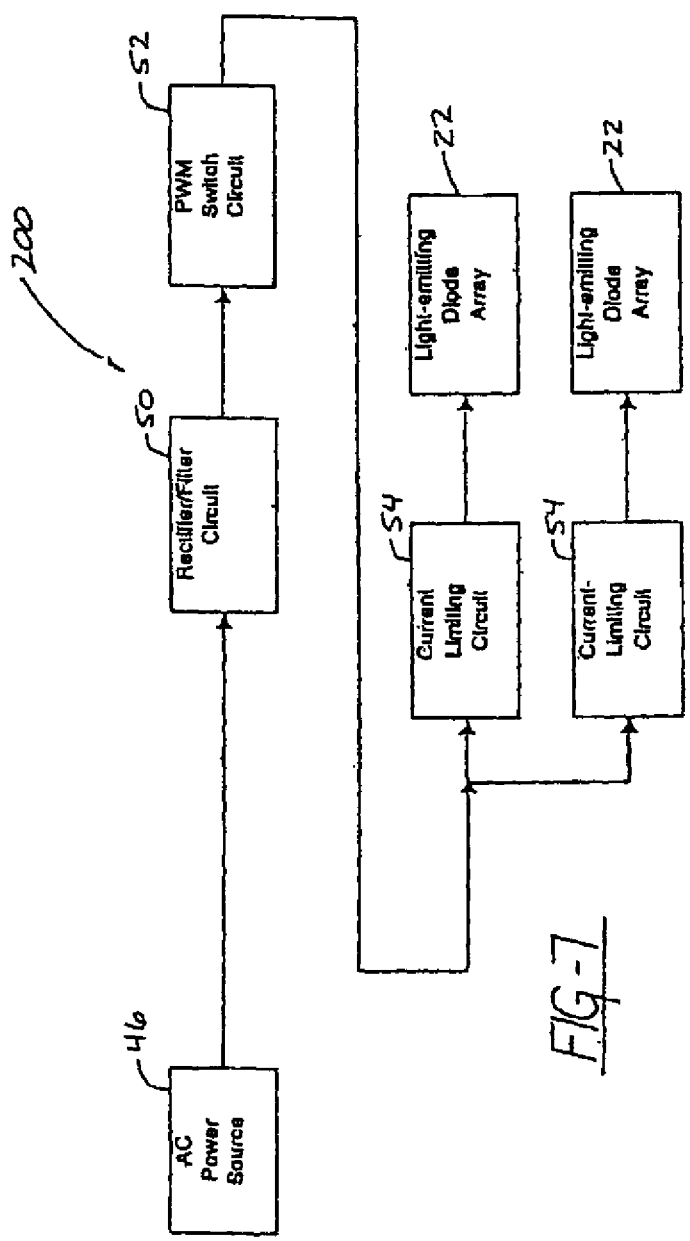
Figure 8:
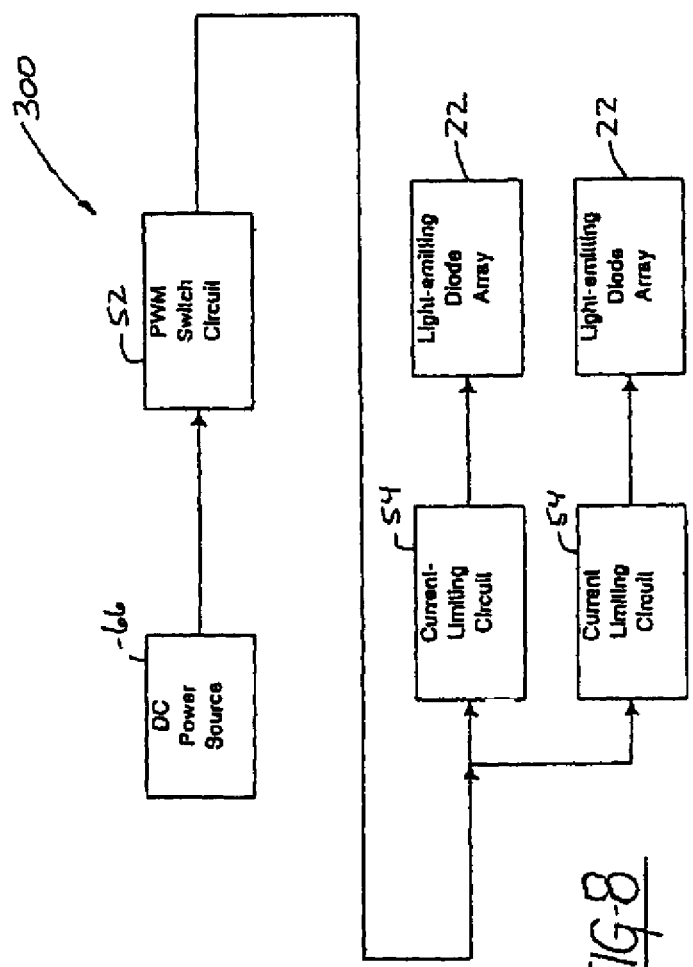

FIG. 10 is an electrical block diagram of a fourth power supply circuit 400 for supplying power to the light tube 20. Unlike the first, second, and third power supply circuits 100, 200, and 300 which are powered through direct electrical male and female connectors 44 and 42, the fourth power supply circuit 400 is powered inductively. As such, the fourth power supply circuit 400 includes a light tube socket 40 having two brackets 68 disposed at opposite ends of the socket 40. At least one bracket 68 includes an inductive transmitter 70. Accordingly, a light tube 20 particularly adapted for use with the fourth power supply circuit 400 has two end caps 26 and 28 with at least one end cap including an inductive receiver or antenna 72. When the light tube 20 is mounted in the light tube socket 40, the at least one inductive receiver 72 in the light tube 20 is disposed adjacent to the at least one inductive transmitter 70 in the light tube socket 40.

The fourth power supply circuit 400 includes the power source 46 which supplies power to the at least one inductive transmitter 70 in the light tube socket 40. The at least one transmitter 70 inductively supplies power to the at least one receiver 72 in one of the end caps 26 and/or 28 of the light tube 20. The at least one inductive receiver 72 supplies power to the rectifier/filter circuit 50. The rectifier/filter circuit 50, PWM circuit 52, and the one or more current-limiting circuits 54 operate as described above to power the one or more arrays of LEDs 22. In this manner, the light tube 20 is powered without a direct electrical connection.

What is claimed is:

1. A light device for illumination by a power supply circuit comprising:
    a bulb portion,
    a first end cap disposed at one end of the bulb portion,
    a second end cap disposed at an end of bulb portion opposite the first end cap, the first and second end caps forming a pair of end caps on opposite ends of the bulb portion; and wherein the bulb portion and the pair of end caps are dimensioned to be mounted in a fluorescent light tube socket, and
    a plurality of light emitting diodes disposed inside the bulb portion, the light emitting diodes in electrical communication with the end cap for illuminating in response to electrical current received from the power supply circuit, and wherein the plurality of light emitting diodes is mounted an at least one circuit board; and wherein each of the plurality of light emitting diodes is mounted at an angular off-set from the circuit board to establish a predetermined radiation pattern of light.

2. A light tube for illumination by a power supply circuit comprising:
    a bulb portion,
    a first pair of end caps disposed at opposite ends of the bulb portion, wherein each of the pair of end caps is shaped to be coupled with a fluorescent light tube socket, and
    a plurality of closely-spaced light emitting diodes disposed inside the bulb portion and extending between the opposite ends of the bulb portion, the light emitting diodes in electrical communication with the pair of end caps for illuminating in response to electrical current received from the power supply circuit; and wherein each of the pair of end caps is an electrical bi-pin connector.

3. In a replacement light tube for a fluorescent light fixture having a light tube socket and a power supply circuit, the improvement comprising:
    a plurality of closely-spaced light emitting diodes disposed inside a bulb portion of the light tube and in electrical communication with a pair of end caps coupled to opposed ends of the bulb portion and engageable with the light tube socket, the plurality of light emitting diodes operable to illuminate in response to electrical current delivered by the fluorescent light; and wherein each of the pair of end caps is an electrical bi-pin connector.

4. The improvement of claim 3, wherein the plurality of light emitting diodes is mounted to a circuit board.

5. The improvement of claim 4, wherein each of the plurality of light emitting diodes is mounted at an angular off-set from the circuit board to establish a predetermined radiation pattern of light.

6. The light device of claim 1 wherein the plurality of light emitting diodes is mounted on only one side of the at least one circuit board.

7. The light device of claim 6 wherein the radiation pattern of light from each of the plurality of light emitting diodes is centered at a 90° angle relative to the at least one circuit board.

8. The light device of claim 1 wherein each of the plurality of light emitting diodes is a white LED.

9. The light device of claim 1, wherein the plurality of light emitting diodes is displaced substantially continuously between the opposite ends of the bulb portion.

10. A light device for illumination by a power supply circuit comprising:
    a bulb portion,
    a first end cap disposed at one end of the bulb portion, and
    a plurality of light emitting diodes disposed inside the bulb portion, the light emitting diodes in electrical communication with the end cap for illumination in response to electrical current received from the power supply circuit; and wherein the plurality of light emitting diodes is mounted on at least one circuit board; and wherein each of the plurality of light emitting diodes is mounted at an angular off-set from the circuit board to establish a predetermined radiation pattern of light; and wherein each of the plurality of light emitting diodes is arranged into one of a plurality of equidistantly-spaced light emitting diode banks, each of the plurality of light emitting diode banks comprising at least two light emitting diodes.

11. The improvement of claim 3 wherein the bulb portion is annular.

12. The improvement of claim 3 wherein the electric current is a direct current signal, the improvement further comprising:

a rectifier for converting an alternating current signal from the fluorescent light fixture to the direct current signal.

13. In a replacement light tube for a flourescent light fixture having a light tube socket and a power supply circuit, the improvement comprising:

a plurality of closely-spaced light emitting diodes disposed inside a bulb portion of the light tube and in electrical communication with a pair of end caps coupled to opposed ends of the bulb portion and engageable with the light tube socket, the plurality of light emitting diodes operable to illuminate in response to electrical current delivered by the flourescent light fixture wherein the electric current is a direct current signal;

a rectifier for converting an alternating current signal from the fluorescent light fixture to the direct current signal; and a pulse-width modulating circuit for receiving the direct current signal and supplying a resulting modulated signal to the plurality of light emitting diodes.

14. The improvement of claim 3 wherein each of the plurality of light emitting diodes is a white LED.

15. In a replacement light tube for a flourescent light fixture having a light tube socket and a power supply circuit, the improvement comprising:

a plurality of closely-spaced light emitting diodes disposed inside a bulb portion of the light tube and in electrical communication with a pair of end caps coupled to opposed ends of the bulb portion and engageable with the light tube socket, the plurality of light emitting diodes operable to illuminate in response to electrical current delivered by the flourescent light fixture; and wherein each of the plurality of light emitting diodes is arranged into one of a plurality of spaced light emitting diode banks, each of the plurality of light emitting diode banks comprising at least two light emitting diodes.

16. The improvement of claim 4 wherein the plurality of light emitting diodes is mounted on only one side of the circuit board to emit light toward only one side of the bulb portion.

17. The improvement of claim 16 wherein the radiation pattern of light from each of the plurality of light emitting diodes is centered at a 90° angle relative to the circuit board.

18. The light device of claim 1 wherein the bulb portion comprises one of clear glass and frosted glass.

19. A retrofit LED light tube for replacing a light tube in a fixture, the retrofit LED light tube comprising:

a elongated cylindrical transparent envelope, a base cap at an end of the envelope, wherein the base cap is an electrical bi-pin connector comprising a first pin and a second pin extending perpendicularly from a surface of the base cap, wherein the first and second pins are adapted to electrically communicate with a fluorescent light socket; and at least one LED device in electrical communication with the base cap, wherein the at least one LED device is electrically connected to a rectifier and the at least one LED device is further electrically connected to a pulse-width modulating circuit receiving a direct current signal from the rectifier and supplying a modulated signal to the at least one LED device.

20. The retrofit light tube of claim 19, wherein the LED device comprises a circuit board and a plurality of LEDs serially connected to the circuit board.

21. The retrofit light tube of claim 19, further comprising:

current-limiting means coupled to the at least one LED device.

22. The retrofit light tube of claim 19 wherein the base cap has circuitry means for connection with an AC source.

23. The light device of claim 1 wherein each of the plurality of light emitting diodes is arranged into one of a plurality of spaced light emitting diode banks, each of the plurality of light emitting diode banks comprising at least two light emitting diodes.

24. The improvement of claim 3 wherein each of the plurality of light emitting diodes is arranged into one of a plurality of spaced light emitting diode banks, each of the plurality of light emitting diode banks comprising at least two light emitting diodes.

25. The improvement of claim 24 wherein each of the plurality of spaced light emitting diode banks is spaced equidistant from adjacent ones of the plurality of spaced light emitting diode banks.

26. The improvement of claim 15 wherein each of the plurality of spaced light emitting diode banks is spaced equidistant from adjacent ones of the plurality of spaced light emitting diode banks.

* * * * *

UNITED STATES PATENT AND TRADEMARK OFFICE
CERTIFICATE OF CORRECTION

| | |
|---|---|
| PATENT NO. | : 7,049,761 B2 |
| APPLICATION NO. | : 09/782375 |
| DATED | : May 23, 2006 |
| INVENTOR(S) | : Memduh Guney et al. |

It is certified that error appears in the above-identified patent and that said Letters Patent is hereby corrected as shown below:

Delete the title page and substitute therefor the attached title page.

Delete Drawings Sheets 1-10 and substitute therefor the attached Drawings Sheets 1-10.

Column 5, Line 63; In claim 1, delete "circuit," and insert -- circuit; --, therefor.

Column 5, Line 64; In claim 1, delete "an" and insert -- on --, therefor.

Column 6, Line 1; In claim 2, delete "tube" and insert -- device --, therefor.

Column 6, Line 4; In claim 2, delete "first" and insert -- pair --, therefor.

Column 6, Line 51; In claim 10, delete "illumination" and insert -- illuminating --, therefor.

Column 8, Line 3; In claim 19, delete "a" and insert -- an --, therefor.

Column 8, Line 3; In claim 19, delete "envelope," and insert -- envelope; --, therefor.

Signed and Sealed this

Twenty-sixth Day of May, 2009

JOHN DOLL
*Acting Director of the United States Patent and Trademark Office*

United States Patent
Timmermans et al.

(10) Patent No.: US 7,049,761 B2
(45) Date of Patent: May 23, 2006

(54) LIGHT TUBE AND POWER SUPPLY CIRCUIT

(75) Inventors: Jos Timmermans, Dearborn, MI (US); Jean C. Raymond, Montreal (CA)

(73) Assignee: Altair Engineering, Inc., Troy, MI (US)

(*) Notice: Subject to any disclaimer, the term of this patent is extended or adjusted under 35 U.S.C. 154(b) by 375 days.

(21) Appl. No.: 09/782,375

(22) Filed: Feb. 12, 2001

(65) Prior Publication Data
US 2002/0060526 A1 May 23, 2002

Related U.S. Application Data
(60) Provisional application No. 60/181,744, filed on Feb. 11, 2000.

(51) Int. Cl.
H05B-37/02 (2006.01)

(52) U.S. Cl. .................. 315/246; 315/291; 315/185 S
(58) Field of Classification Search ............. 315/146, 315/291, 185 S, 312, 324, 192, 185 R, 295, 315/246, 187, 294, 56, 200 A, 61; 340/815.45; 362/488, 240, 219, 800, 369, 545, 288, 249
See application file for complete search history.

(56) References Cited

U.S. PATENT DOCUMENTS

| 4,581,687 A | | 4/1986 | Nakanishi | |
|---|---|---|---|---|
| 4,748,545 A | * | 5/1988 | Schmitt | 362/219 |
| 5,388,357 A | | 2/1995 | Malita | |
| 5,463,280 A | * | 10/1995 | Johnson | 315/187 |
| 5,575,459 A | | 11/1996 | Anderson | |
| 5,607,227 A | | 3/1997 | Yasumoto et al. | |
| 5,655,830 A | | 8/1997 | Ruskouski | |
| 5,688,042 A | * | 11/1997 | Madadi et al. | 362/240 |
| 5,697,695 A | | 12/1997 | Lin et al. | |
| 5,726,535 A | * | 3/1998 | Yan | 315/185 R |
| 5,813,751 A | * | 9/1998 | Shaffer | 362/222 |
| 5,890,794 A | * | 4/1999 | Abtahi et al. | 362/183 |
| 5,924,784 A | * | 7/1999 | Chliwnyj et al. | 362/234 |
| 5,949,347 A | * | 9/1999 | Wu | 340/815.45 |
| 6,072,280 A | * | 6/2000 | Allen | 315/185 S |
| 6,158,882 A | * | 12/2000 | Bischoff, Jr. | 362/488 |
| 6,305,109 B1 | * | 10/2001 | Lee | 40/546 |
| 6,325,651 B1 | * | 12/2001 | Nishihara et al. | 439/232 |
| 6,371,637 B1 | * | 4/2002 | Atchinson et al. | 362/555 |
| 6,394,623 B1 | * | 5/2002 | Tsui | 362/249 |
| 6,577,072 B1 | * | 6/2003 | Saito et al. | 315/185 R |
| 6,582,103 B1 | * | 6/2003 | Popovich et al. | 362/307 |
| 6,621,222 B1 | * | 9/2003 | Hong | 315/51 |

OTHER PUBLICATIONS

Web page at http://trucklite.com/leds14.html printed on Jan. 13, 2000.
Web page at http://trucklite.com/leds2.html printed on Jan. 13, 2000.
Web page at http://trucklite.com/leds4.html printed on Jan. 13, 2000.
Web page at http://www.telecite.com/en/products/options_en.htm printed on Jan. 13, 2000.
Web page at http://www.dialight.com/trans.htm printed on Jan. 13, 2000.
Web page at http://www.ledlights.com/replac.htm printed on Jan. 13, 2000.
Ledtronics, apparently 1996 Catalog, apparently cover page and p. 10.

* cited by examiner

Primary Examiner—Wilson Lee
Assistant Examiner—Chuc Tran
(74) Attorney, Agent, or Firm—Young & Basile, P.C.

(57) ABSTRACT

The present invention provides a light tube for illumination by a power supply circuit including a bulb portion and a pair of end caps disposed at opposite ends of the bulb portion. A plurality of light emitting diodes are disposed inside the bulb portion and in electrical communication with the pair of end caps for illuminating in response to electrical current to be received from the power supply circuit.

26 Claims, 10 Drawing Sheets

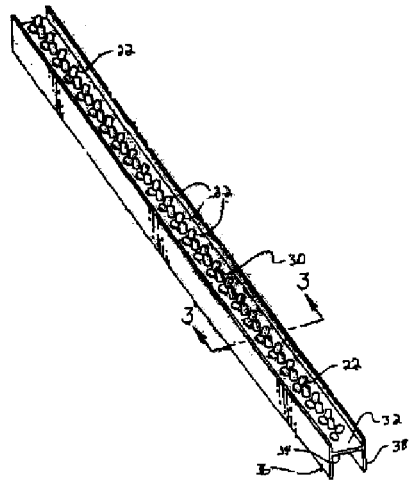

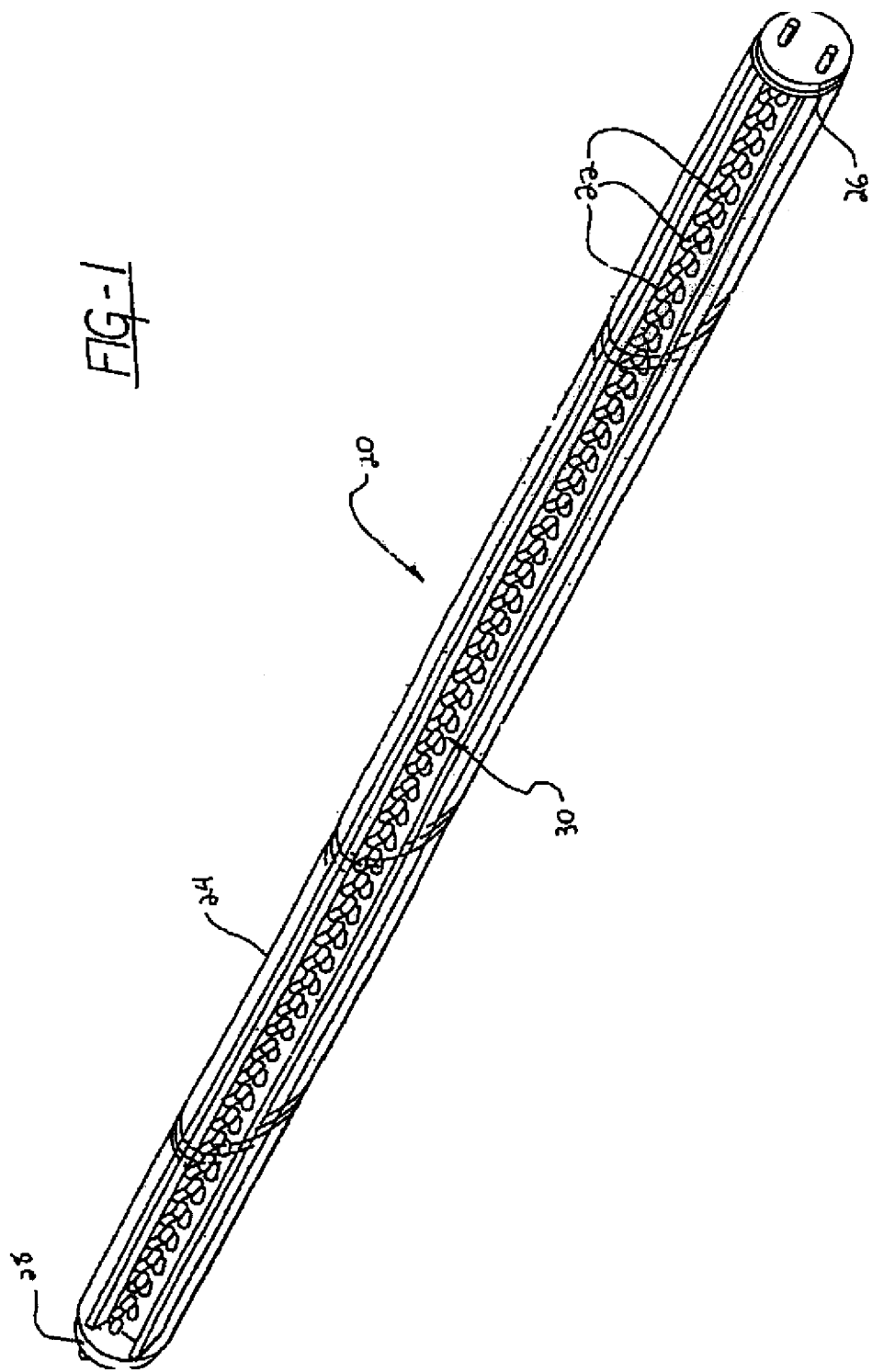

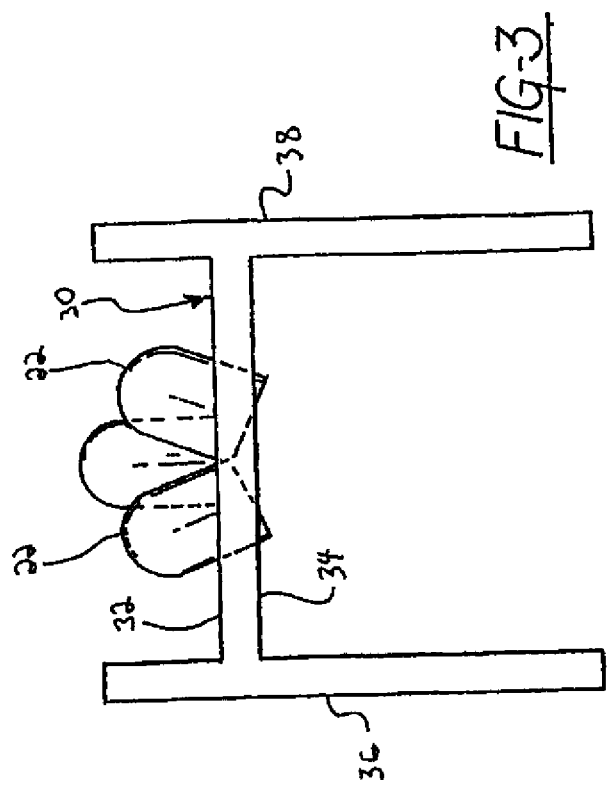

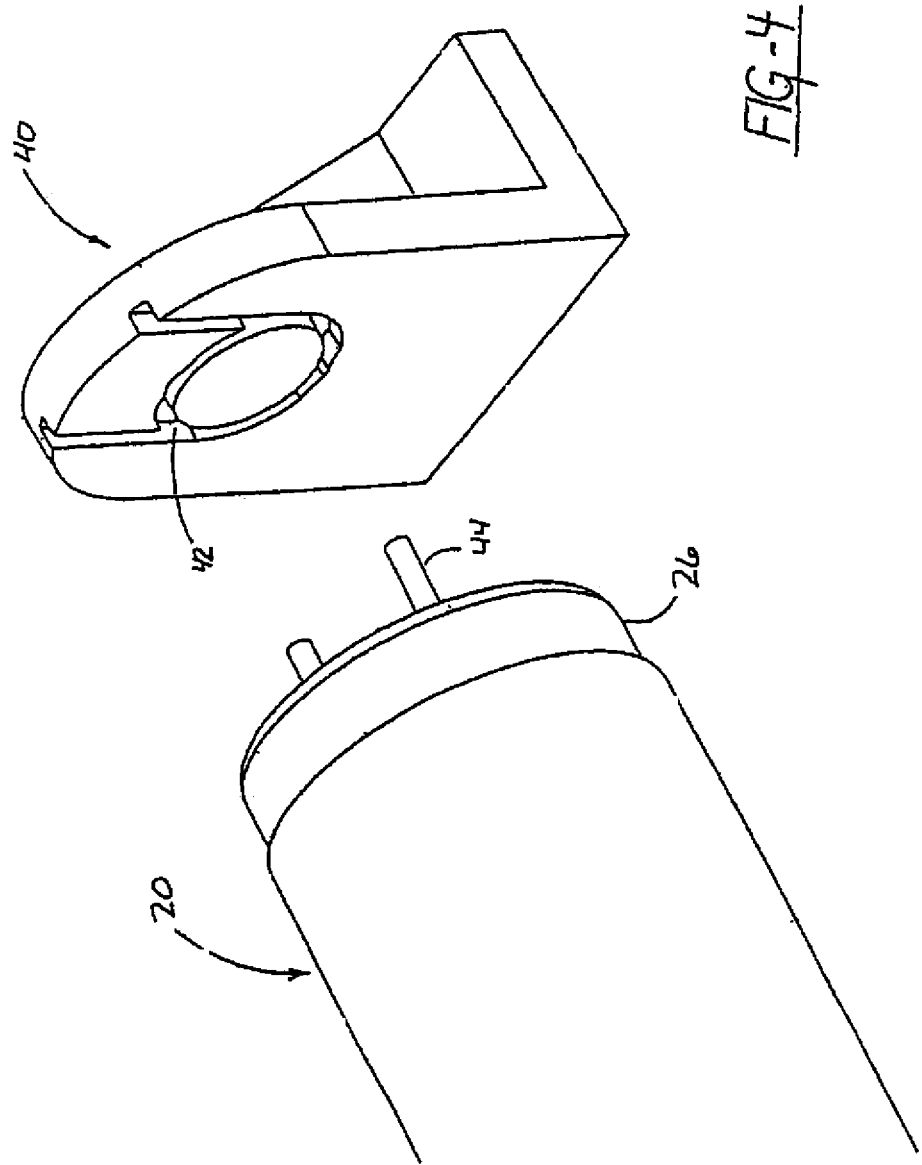

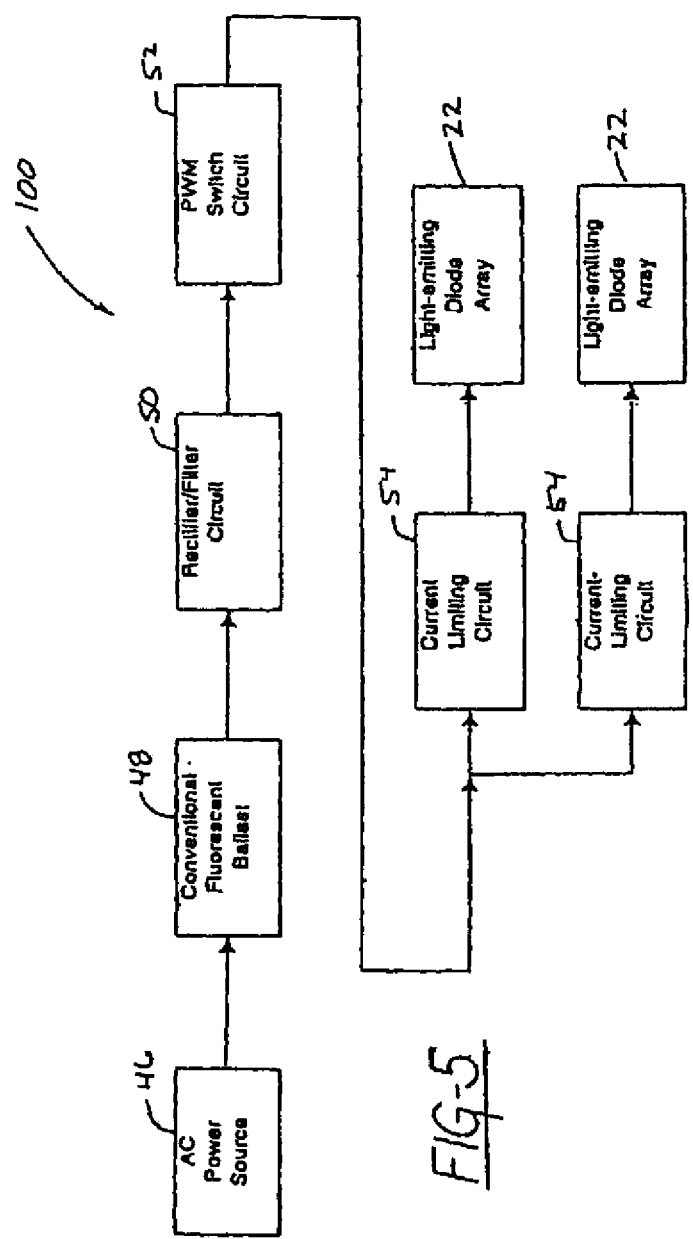

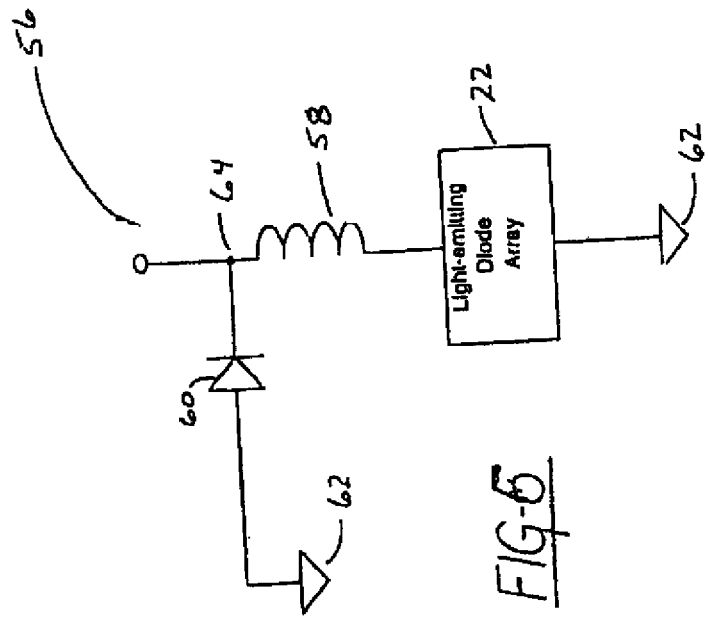

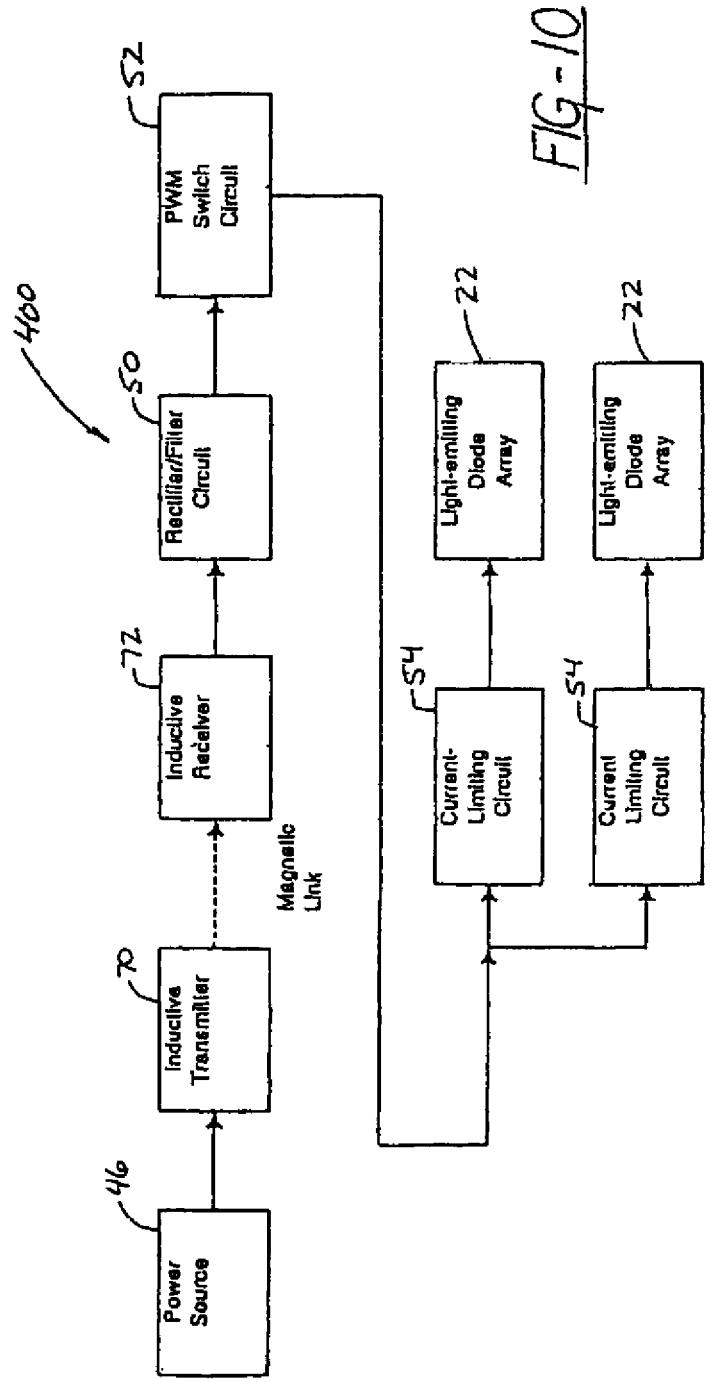

UNITED STATES PATENT AND TRADEMARK OFFICE
Certificate

Patent No. 7,049,761 B2

Patented: May 23, 2006

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Jos Timmermans, Dearborn, MI (US); Jean C. Raymond, Montreal (CA); and John Ivey, Farmington Hills, MI (US).

Signed and Sealed this Second Day of June 2009.

DOUGLAS W. OWENS
*Supervisory Patent Examiner*
Art Unit 2821